(12) United States Patent
Thompson et al.

(10) Patent No.: US 12,261,049 B2
(45) Date of Patent: Mar. 25, 2025

(54) SELECTIVE ETCH OF A SUBSTRATE

(71) Applicant: APPLIED MATERIALS, INC., Santa Clara, CA (US)

(72) Inventors: David Thompson, Santa Clara, CA (US); Bhaskar Jyoti Bhuyan, Santa Clara, CA (US); Mark Saly, Santa Clara, CA (US); Lisa Enman, Santa Clara, CA (US); Aaron Dangerfield, Santa Clara, CA (US); Jesus Candelario Mendoza, Santa Clara, CA (US); Jeffrey W. Anthis, Santa Clara, CA (US); Lakmal Kalutarage, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 351 days.

(21) Appl. No.: 17/836,562

(22) Filed: Jun. 9, 2022

(65) Prior Publication Data
US 2023/0420259 A1 Dec. 28, 2023

(51) Int. Cl.
*H01L 21/306* (2006.01)
*H01L 21/02* (2006.01)
*H01L 21/027* (2006.01)
*H01L 21/308* (2006.01)
*H01L 21/311* (2006.01)
*H01L 21/3213* (2006.01)

(52) U.S. Cl.
CPC .. *H01L 21/30604* (2013.01); *H01L 21/02063* (2013.01); *H01L 21/02118* (2013.01); *H01L 21/02126* (2013.01); *H01L 21/0271* (2013.01); *H01L 21/3081* (2013.01); *H01L 21/31116* (2013.01); *H01L 21/32135* (2013.01); *H01L 21/02115* (2013.01); *H01L 21/02219* (2013.01); *H01L 21/02263* (2013.01)

(58) Field of Classification Search
None
See application file for complete search history.

(56) References Cited

U.S. PATENT DOCUMENTS 7,524,735 B1 4/2009 Gauri et al.
9,219,006 B2 12/2015 Chatterjee
(Continued)

FOREIGN PATENT DOCUMENTS

WO 2016131024 A1 8/2016

OTHER PUBLICATIONS

International Search Report and Written Opinion for International Application No. PCT/US2023/024593, mailed Oct. 20, 2023, 16 Pages.

*Primary Examiner* — Jiong-Ping Lu
(74) *Attorney, Agent, or Firm* — Lowenstein Sandler LLP

(57) ABSTRACT

Described herein is a method for selectively cleaning and/or etching a sample. The method includes selectively forming a film in a trench of a substrate such that the trench may be selectively etched. A polymer film is deposited on the bottom surface of the trench without being deposited on the side wall. A second film is selectively formed in the trench without forming the second film on the polymer film. The polymer is then removed from the bottom surface of the trench and then etching is performed on the bottom surface of the trench using an etch chemistry, wherein the second film protects the side wall from being etched.

18 Claims, 5 Drawing Sheets

(56) References Cited

U.S. PATENT DOCUMENTS

| | | |
|---|---|---|
| 9,412,581 B2 | 8/2016 | Thadani et al. |
| 2012/0142193 A1* | 6/2012 | Ogihara ................ G03F 7/095 |
| | | 257/E21.241 |
| 2016/0343580 A1* | 11/2016 | Hudson ............ H01L 21/67069 |
| 2017/0117118 A1* | 4/2017 | Toh ................... H01J 37/32715 |
| 2018/0174858 A1 | 6/2018 | Hudson |
| 2020/0058496 A1 | 2/2020 | Li et al. |
| 2020/0170118 A1 | 5/2020 | Kato et al. |
| 2020/0279757 A1* | 9/2020 | Kumakura ........ H01L 21/31144 |

\* cited by examiner

SELECTIVE ETCH OF A SUBSTRATE

TECHNICAL FIELD

Embodiments of the present disclosure relate, in general, to a method for etching a substrate, wherein the method for etching uses a flowable polymer film to enable improved etch selectivity between different regions of the substrate.

BACKGROUND

In the semiconductor industry, devices are fabricated by a number of manufacturing processes producing structures of an ever-decreasing size. As device geometries shrink, controlling the process uniformity and repeatability of devices becomes much more challenging, especially in upstream processes.

Integrated circuits are made possible by processes which produce intricately patterned material layers on substrate surfaces. Producing patterned material on a substrate uses controlled methods of formation and removal of exposed material. For example, in a gap filling operation, a material may be formed or deposited to fill a trench or other feature formed on a semiconductor substrate. As trenches or features may be characterized by higher aspect ratios and reduced critical dimensions, these filling operations may be challenging. For example, as the deposition may occur at the top and along side walls of the trench or feature, continued deposition may pinch off the trench or feature including between the sidewalls within the trench, and may produce voids. This can then impact device performance and subsequent processing operations. In current etching processes, the substrate may be made of silicon and silicon nitride. When the substrate is exposed to air, it may have a bottom including silicon oxide (SiO) and side walls of oxidized silicon nitride (SiON). As devices are getting smaller, target etch parameters have also decreased. To address this, selective etching or selective chemical passivation is preferred. Because the bottom and side walls include similar materials (SiO and SiON), selective etching or selective chemical passivation is difficult to apply. Thus, there is a need to improve the selective etching of the substrate such that the smaller target etch parameters can be achieved.

SUMMARY

In some embodiments of the present disclosure, a method of cleaning and etching a sample is provided. The method may include placing a substrate into a chamber, wherein the substrate may include a layer including at least one trench formed therein. The at least one trench of the method may have a top surface, a bottom surface and at least one side will. In some embodiments, the method may include depositing a polymer film on the bottom surface of the at least one trench without depositing the polymer film on the at least one side wall of the at least one trench. In some embodiments, the method may include selectively forming a second film on the layer without forming the second film on the polymer film. In some embodiments, the method may include removing the polymer film from the bottom surface of the at least one trench. In some embodiments, the method may further include etching the bottom surface of the trench using an etch chemistry, wherein the second film protects the at least one sidewall from the etch chemistry.

In another embodiment of the present disclosure, a method of cleaning and etching a substrate is provided. The method may include placing a substrate into a chamber, wherein the substrate including a layer having at least one trench formed therein, the at least on trench having a top surface, a bottom surface and at least one side wall. The method further includes depositing a polymer film on the bottom surface of the at least one trench without depositing the polymer film on the at least one side wall of the at least one trench and selectively forming a second film on the layer without forming the second film on the polymer film. The method further includes removing the polymer film from the bottom surface of the at least one trench, performing an etch process, wherein the etch process includes applying ammonium fluoride to the substrate. The etch process of the method may selectively interacts with the bottom surface of the at least one trench and does not interact with the top surface and the at least one side wall.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
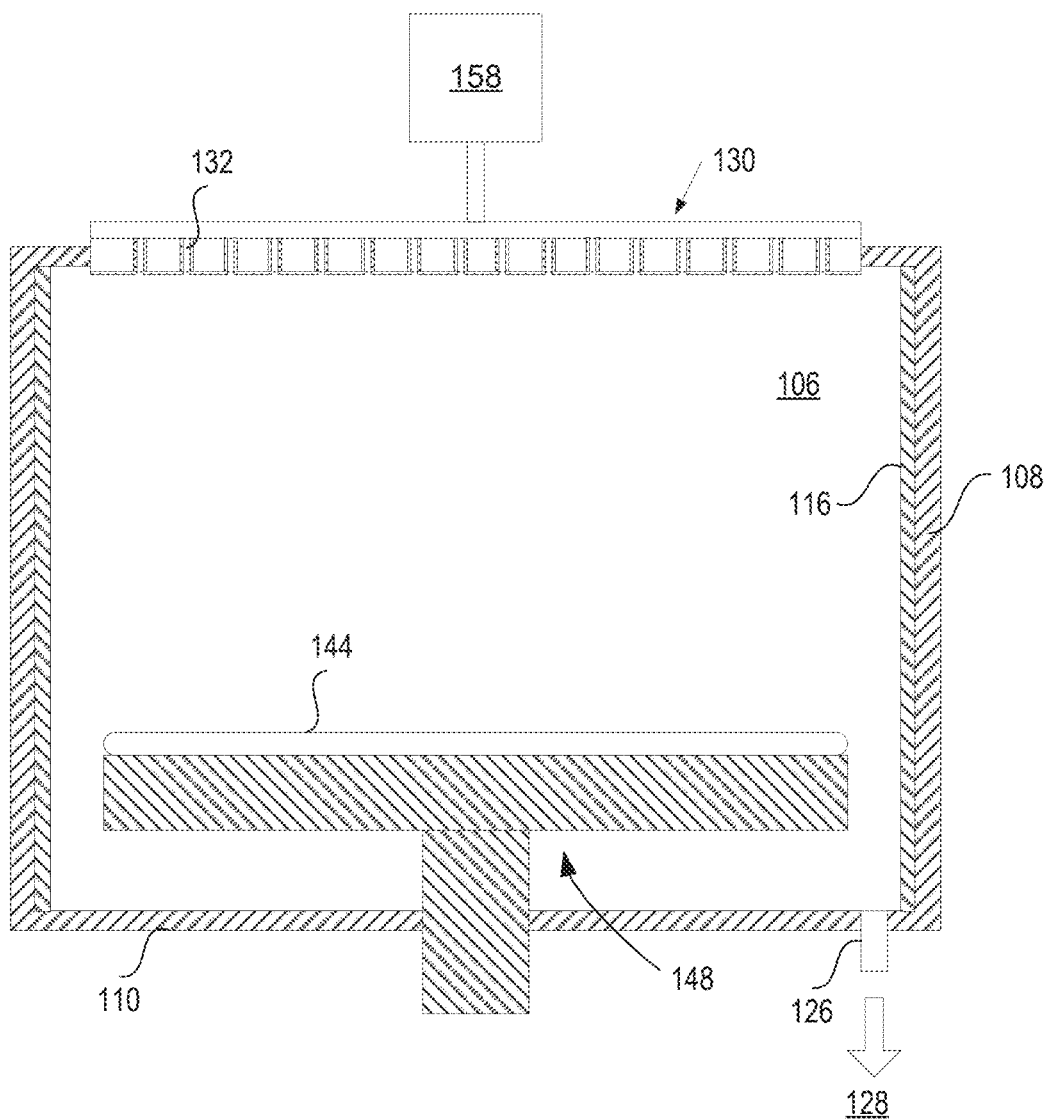
FIG. 1 depicts a sectional view of one embodiment of a processing chamber.

Polymer films may be used in semiconductor device manufacturing for a number of structures and processes, including as a mask material, an etch resistant material, and a trench fill material, among other applications. More specific examples of applications for polymer films include the formation of hot implant hardmasks, metal gate (MG)-cut hardmasks, MG fabrication, and reverse tone patterning, among others. The present disclosure includes the formation of the polymer films on semiconductor substrates using molecular layer deposition (MLD).

Embodiments disclosed herein describe a method for selectively cleaning and/or selectively etching a substrate. The method for cleaning/etching a substrate may include placing a substrate into a chamber, where the substrate may include a layer including at least one trench formed therein, the at least one trench having a top surface, a bottom surface and at least one side wall. The method for etching may include depositing a polymer film on the bottom surface of the at least one trench without depositing the polymer film on the at least one side wall of the at least trench. The method may further include selectively forming a blocking film on the layer without forming the blocking film on the polymer film. The blocking film may be formed, for example, using a self-assembled monolayer (SAM) deposition technique. The method may further include removing the polymer film from the bottom surface of the at least one trench and etching the bottom surface of the trench using an etch chemistry, wherein the blocking film protects the at least one side wall from the etch chemistry.

By using different films to selectively coat one or more portions of the substrate, the profile of the substrate may be improved and blowouts of critical dimension of the trench may be improved. It has been found that using a self-assembled monolayer (SAM) blocks and/or protects a surface from being etched. By selectively protecting a surface from being etched, this allows for removal of material (e.g., such as any oxidized surfaces) in selective regions of the trench while avoiding a blowout of a critical dimension (e.g., such as a trench width or cross-sectional profile). The inventors have found that the bottom surfaces of trenches in a substrate often are oxidized, which is generally detrimental to performance in the final product. To remove oxidized surfaces, an etching process step may be performed. However, at this stage, not every surface needs to be etched, as it could affect a profile of the substrate (e.g., of trenches formed in or on the substrate).

Therefore, the SAM may be formed on a top surface, a side surface, or a combination thereof to protect these surfaces from etching. The inventors have found that depositing a polymer film on the bottom surface of the trench prevents the SAM from forming on the bottom surface, such that SAM is formed on the top surface, a side wall surface, or combination thereof. The SAM consists of an ordered arrangement of spontaneously assembled organic molecules adsorbed on a surface in embodiments. These molecules typically comprise of one or more moieties with an affinity for the substrate (head group) and a relatively long, inert, linear In embodiments, a flowable polymer is deposited on the substrate, where the flowable polymer does not adhere to sidewalls of trenches, and instead pools at bottoms of the trenches. The flowable polymer may set or harden on the bottom of the surface of the trenches without forming on the sidewalls of the trenches. The SAM may then not adhere to the polymer that has been selectively deposited in the bottom of the trenches. Therefore after the SAM is selectively formed (e.g., everywhere except for on the polymer at the bottom of the trenches), the polymer film at the bottom of the trenches may be removed. An etch chemistry may then selectively etch an oxide on the bottom surface of the trench and/or etch the bottom surface of the trench at a much higher rate than the etch chemistry etches the SAM. Accordingly, the SAM protects the sidewalls and/or tops of the trenches from etching and the etching may be selectively performed on the bottom surfaces of the trenches.

By selectively etching or cleaning the surfaces of the trenches of the substrate without etching other surfaces of the trenches, it was found to produce lower variability in trench width across a depth of trenches in etched samples (i.e., substrates) when compared to traditional plasma etch processes. Thus, the inventors have found a method to selectively clean or etch the bottom surface of a trench without or with little etching of tops and/or sidewalls of the trenches.

In embodiments, the SAM may be selectively formed on the surfaces other than on the polymer film because the SAM and polymer film have different chemical reactivity. Therefore, the SAM may react with the surfaces that do not have a polymer film on them according to aspects of the present disclosure.

Disclosed herein are embodiments of a method for selectively cleaning or etching a substrate including depositing a polymer film and selectively forming a second film on the substrate. The polymer film is then removed and the substrate is etched until a target amount of the substrate has been etched. The polymer film may be deposited on a bottom surface of at least one trench of a substrate such that when the second film is formed on the substrate it does not form on the bottom surface because of the polymer film. It has been found that the polymer film and second film may have different chemical reactivity to control the selectivity on which the films are deposited and/or formed.

As used herein, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A substrate as used herein may also refer to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, silicon germanium, and any other materials such as metals, metal nitrides, metal alloys, and other conductive materials, depending on the application. Substrates include, without limitation, semiconductor wafers.

Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated $Si_xGe_{1-x}$, and the second substrate surface may comprise a Si-containing dielectric, or vice versa. In some embodiments, a substrate surface may comprise certain functionality (e.g., —OH, —NH, etc.).

Referring now to the figures, FIG. 1 is a sectional view of a processing chamber 100 (e.g., a semiconductor processing chamber) having one or more chamber components in accordance with embodiments of the present disclosure. The processing chamber 100 may be used for processes in which a corrosive plasma environment and/or corrosive chemistry is provided. For example, the processing chamber 100 may be a chamber for a plasma etch reactor (also known as a plasma etcher). Examples of chamber components that may be exposed to plasma in the processing chamber 100 are a substrate support assembly 148, an electrostatic chuck (ESC), a ring (e.g., a process kit ring or single ring), a chamber wall, a base, a showerhead 130, a gas distribution plate, a liner, a liner kit, a shield, a plasma screen, a flow equalizer, a cooling base, a chamber viewport, a chamber lid, a nozzle, process kit rings, and so on. In embodiments, processing chamber 100 is used to perform an etch process on a patterned substrate that includes a plurality of trenches formed thereon.

In one embodiment, the processing chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include the multi-layer plasma resistant coating.

An outer liner 116 may be disposed adjacent the sidewalls 108 to protect the chamber body 102. The outer liner 116 may be a halogen-containing gas resist material such as $Al_2O_3$ or $Y_2O_3$. The outer liner 116 may be coated with the multi-layer plasma resistant ceramic coating in some embodiments.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewalls 108 of the chamber body 102 and/or on a top portion of the chamber body. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or carrier gases to the interior volume 106 through the showerhead 130 or lid and nozzle. Examples of process gas that may be delivered by the gas panel 158 and used to process substrates/samples in the processing chamber 100 include a silicon containing gas, halogen-containing gases, such as $C_2F_6$, $SF_6$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$ or $N_2O$. Examples of carrier gases (also referred to herein as a diluent) include $N_2$, He, Ar, and other gases inert to process gases (e.g., non-reactive gases). The showerhead 130 includes multiple gas delivery holes 132 throughout the showerhead 130. The showerhead 130 may be or may include aluminum, anodized aluminum, an aluminum alloy (e.g., Al 6061), or an anodized aluminum alloy. In some embodiments, the showerhead includes a gas distribution plate (GDP) bonded to the showerhead. The GDP may be, for example, Si or SiC. The GDP may additionally include multiple holes that line up with the holes in the showerhead.

A substrate support assembly 148 is disposed in the interior volume 106 of the processing chamber 100 below the showerhead 130. The substrate support assembly 148 holds a substrate 144 (e.g., a wafer) during processing. The substrate support assembly 148 may include an electrostatic chuck that secures the substrate 144 during processing, a metal cooling plate bonded to the electrostatic chuck, and/or one or more additional components. An inner liner may cover a periphery of the substrate support assembly 148. The inner liner may be a halogen-containing gas resist material such as $Al_2O_3$ or $Y_2O_3$. The substrate support assembly, portions of the substrate support assembly, and/or the inner liner may be coated with the metal layer and barrier layer in some embodiments.

The processing chamber 100 may be an etch chamber. In embodiments, the etch process is performed to selectively etch films disposed on surfaces of the substrate 144. For example, the substrate 144 may be a semiconductor wafer, a glass plate, a SiGe wafer, or another type of substrate. In one embodiment, the films disposed on the substrate 144 include a polymer film and a self-assembled monolayer. The substrate 144 may further include silicon (Si).

Figure 2:
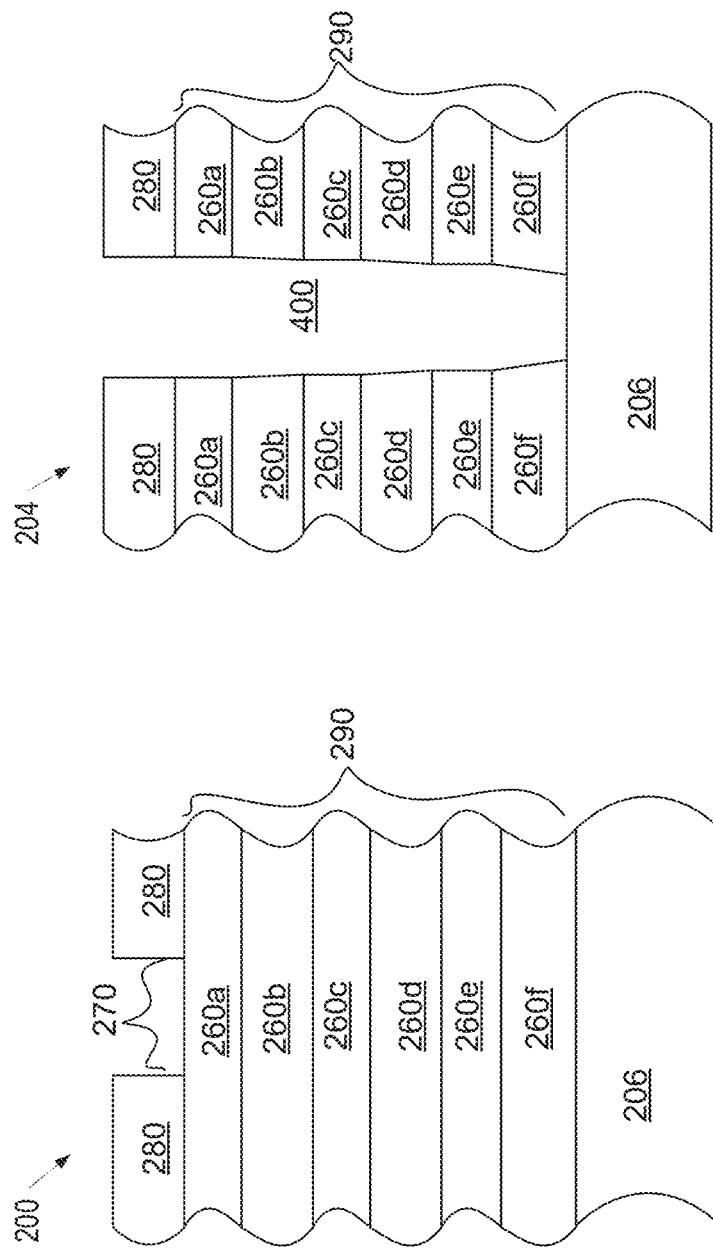
FIG. 2A depicts a sectional view of one embodiment of multiple layers of a sample.
FIG. 2B depicts a sectional view of one embodiment of multiple layers of a sample where the sample has been etched to have a U-profile.

FIG. 2A displays a sectional view of an article 200 including a substrate 206. In some embodiments, the article 200 may have a stack of layers (e.g., alternating layers of two or more materials). The stack of layers may include a stack of silicon (Si) layers, silicon germanium (SiGe) layers, silicon nitride (SiN) layers, silicon dioxide ($SiO_2$) layers, and so on. In embodiments, the stacks include stacks of alternating layers of two or more of the aforementioned materials (e.g., alternating stacks of Si and SiGe, alternating stacks of Si and $SiO_2$, and so on). In one embodiment, article 200 corresponds to substrate 144 of FIG. 1. The substrate 206 includes Si layers 260a-f disposed thereon in a stack 290. The Si layers 260a-f may be in the form of nanosheets (e.g., layers having thicknesses on the scale of nm) in some embodiments. In one embodiment, all of the Si layers 260a-f have approximately the same thickness. Alternatively, different Si layers 260a-f may have different thicknesses.

A pattern mask 280 (also referred to as an etch mask) may cover a top layer 260a in the stack 290. The pattern mask 280 may be a soft mask or a hard mask. Some hard masks that may be used include a polysilicon hard mask and a metal hard mask such as a tungsten hard mask or a titanium nitride hard mask. Pattern mask 280 includes open areas 270 which expose underlying layers to etch chemicals during etching processes. The pattern mask 280 additionally includes covered regions that protect underlying layers from etch chemicals. Regions of the stack 290 under the open areas 270 that are not protected by the pattern mask 280 may undergo an etching process.

The article 200 can be etched through the pattern mask 280 to create cavities or trenches having approximately the shape of the openings in the pattern mask 280. Etchants will typically also etch the pattern mask 280 at some etch rate.

FIG. 2B shows a sectional view of an article 204 including the substrate 206 having the stack of layers 260 a-f that has undergone an etch process. The etch process may be any etching process used in the art, including chemical etching. The chemical etching may include forming ammonium fluoride salt using ammonia and hydrofluoric acid. Other chemical etching may include, but are not limited to, using ammonia and water, NHF, $NH_4F$, hydrogen fluoride, or hydrogen chloride. The process has etched a cavity 400 (e.g., a trench) in the layers 260 a-f. In one embodiment, the cavity 400 has a tapered cross sectional shape in which a bottom of the cavity is slightly narrower than a top of the cavity, having a U-profile. Notably, the sidewalls of trenches or holes formed from the etching process set forth in embodiments herein are nearly vertical, as opposed to sidewalls produced by prior etching processes.

In embodiments, a native oxide may form on a bottom of the trenches. In order to remove the native oxide, one or more etch or clean processes may be performed. However, these etch or clean processes may also etch sidewalls of the trench, which may change a profile of the trench. Additionally, or alternatively, after the trenches are formed, further processes may be performed to etch the substrate 206 that may be exposed at a bottom of the trenches. However, etching the trench bottom (e.g., the substrate 206) may also cause etching of the sidewalls of the trenches, again changing the profile of the trench walls. This may affect a critical dimension of manufactured devices. Embodiments described herein enable the bottom of the trench to be cleaned or etched without negatively impacting the profile or critical dimensions of devices (e.g., of the trenches).

In embodiments, the bottom of the trench is cleaned and/or etched using a process that includes depositing a flowable film on a bottom of the trench without depositing the flowable film on sidewalls of the trench. The flowable film may be, for example, a liquid flowable chemical vapor deposition (CVD) film. A liquid flowable CVD film may be used to fill or partially fill trenches with up to 30:1 aspect ratios. In embodiments, the flowable film lacks carbon in the film, which hampers transistor isolation and causes voltage shifts and leakage. The flowable film may be formed by depositing a liquid precursor that flows to low points, and then reacting the liquid precursor with one or more other materials to form a film.

In other embodiments, the flowable film may be formed by introducing a reactant and a precursor into a chamber, such that the reactants are present in the chamber in the vapor phase and form a flowable film. Thus, the flowable film by flowed into the trenches and deposited at the bottom of the trenches.

Subsequent to formation of the flowable film, a self-assembled monolayer (SAM) is formed. The SAM may not form on the flowable film, but may form on other exposed surfaces. Accordingly, in embodiments the SAM may form everywhere except on the flowable film at the bottom of the trenches. After the SAM is formed, the flowable film may be removed from the bottom of the trenches. An etch process may then be performed, where the etch process may have a high selectivity of a material at a bottom of the trenches (e.g., Si or a native oxide such as $SiO_2$) over the SAM.

Figure 3:
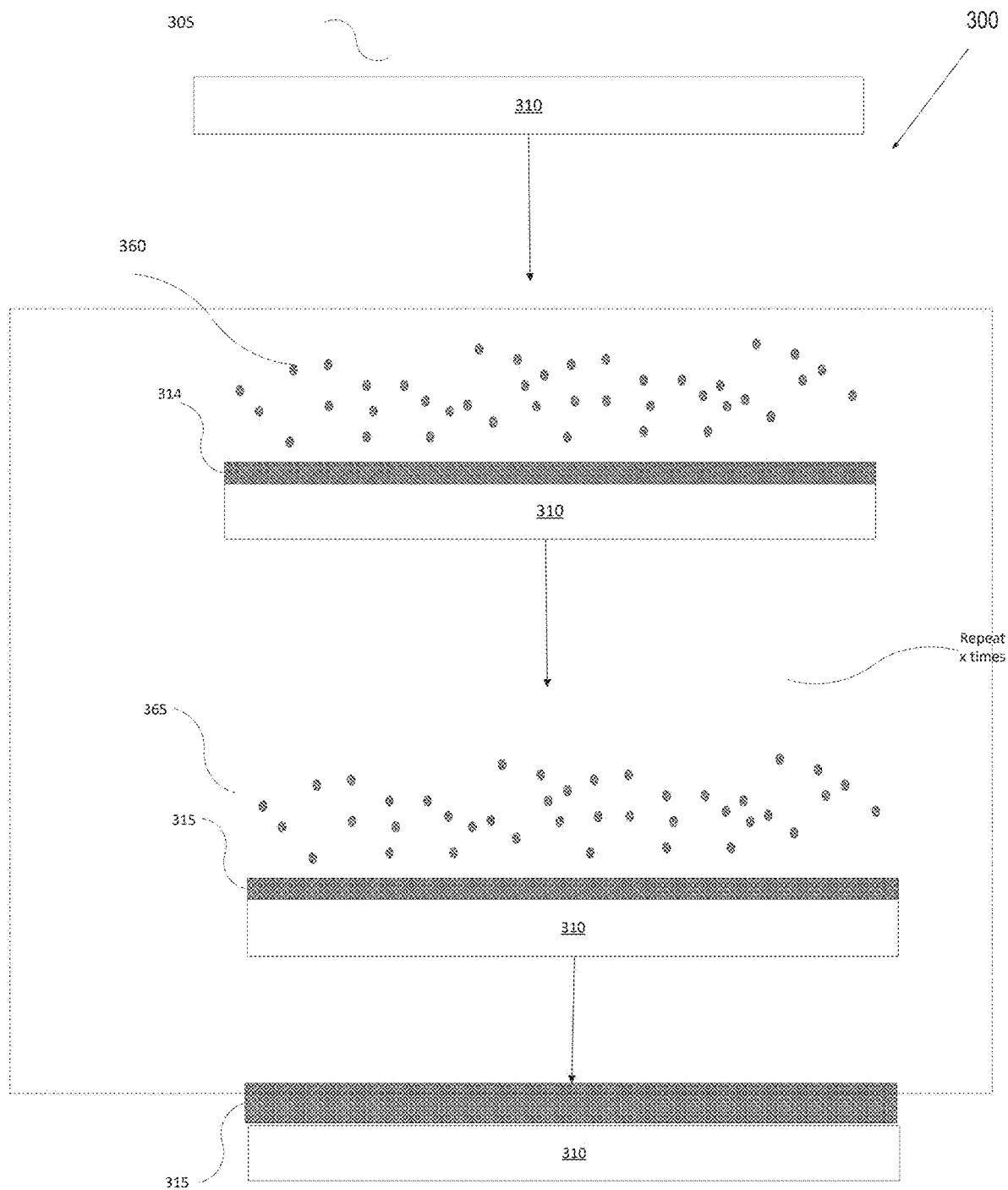
FIG. 3 depicts a deposition process in accordance with a variety of Molecular Layer Deposition techniques.

FIG. 3 illustrates a process for forming a self-assembled monolayer (SAM) on a surface 305 of a substrate 310. Substrate 310 may represent, for example, a semiconductor wafer with one or more trenches formed thereon (e.g., trenches formed from stacks of alternating materials such as Si and $SiO_2$). As understood in the art, SAM may be organic molecules, where the molecules are formed spontaneously on surfaces by adsorption and are organized into more or less large ordered domains. In some embodiments, the molecules that form the SAM do not interact strongly with the substrate. In other embodiments, the molecules may possess a head group that has a strong affinity to the substrate and anchors the molecule to it. The article 310 and surface 305 may be made from, for example, Si, $SiO_2$, SiG, SiN, or any other material or combination of materials.

Each individual chemical reaction between a precursor and the surface is known as a "half-reaction." During each half reaction, a precursor is pulsed onto the surface for a period of time sufficient to allow the precursor to fully react with the surface. The reaction is self-limiting as the precursor will only react with a finite number of available reactive sites on the surface, forming a uniform continuous adsorption layer on the surface. Any sites that have already reacted with a precursor will become unavailable for further reaction with the same precursor unless and/or until the reacted sites are subjected to a treatment that will form new reactive sites on the uniform continuous coating. Exemplary treatments may be plasma treatment, treatment by exposing the uniform continuous adsorption layer to radicals, or introduction of a different precursor able to react with the most recent uniform continuous film layer adsorbed to the surface.

In FIG. 3, substrate 310 having surface 305 may be introduced to a first precursor 360 for a first duration until a first half reaction of the first precursor 360 with surface 305 partially forms layer 315 by forming an adsorption layer 314. In embodiments, the adsorption layer 314 does not form on a flowable film that may have been deposited on one or more portions of the surface 305 (e.g., at a bottom of trenches formed on the surface 305). Subsequently, article 310 may be introduced to a second precursor 365 (also referred to as a reactant) to cause a second half reaction to react with the adsorption layer 314 and fully form the layer 315. Layer 315 may be uniform, continuous and conformal. The substrate 310 may alternately be exposed to the first precursor 360 and second precursor 365 up to x number of times to achieve a target thickness for the layer 315. X may be an integer from 1 to 100, for example.

The surface reactions (e.g., half-reactions) are done sequentially. Prior to introduction of a new precursor, the chamber in which the ALD or MLD process takes place may be purged with an inert carrier gas (such as nitrogen or air) to remove any unreacted precursor and/or surface-precursor reaction byproducts. At least two precursors may be used in embodiments. In some embodiments, more than two precursors may be used to grow film layers having the same composition (e.g., to grow multiple layers of SAM on top of each other). In other embodiments, different precursors may be used to grow different film layers having different compositions.

ALD or MLD processes may be conducted at various temperatures depending on the type of ALD or MLD process. The optimal temperature range for a particular ALD or MLD process is referred to as the "ALD temperature window" or "MLD temperature window." Temperatures below the temperature window may result in poor growth rates and non-ALD type deposition. Temperatures above the temperature window may result in thermal decomposition of the article or rapid desorption of the precursor. The temperature window may range from about 20° C. to about 400° C. In some embodiments, the MLD temperature window is between about 200-350° C.

The ALD/MLD process allows for conformal film layers having uniform film thickness on articles and surfaces having complex geometric shapes, holes with large aspect ratios, and three-dimensional structures. Sufficient exposure time of the precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets).

With the ALD/MLD technique, films such as self-assembled monolayers (SAMs) may be grown, for example, by proper sequencing of the precursors.

In previous embodiments, chemical passivation or directional etching was used to selectively etch the bottom surface of a trench and not etch the side walls.

Figure 4:
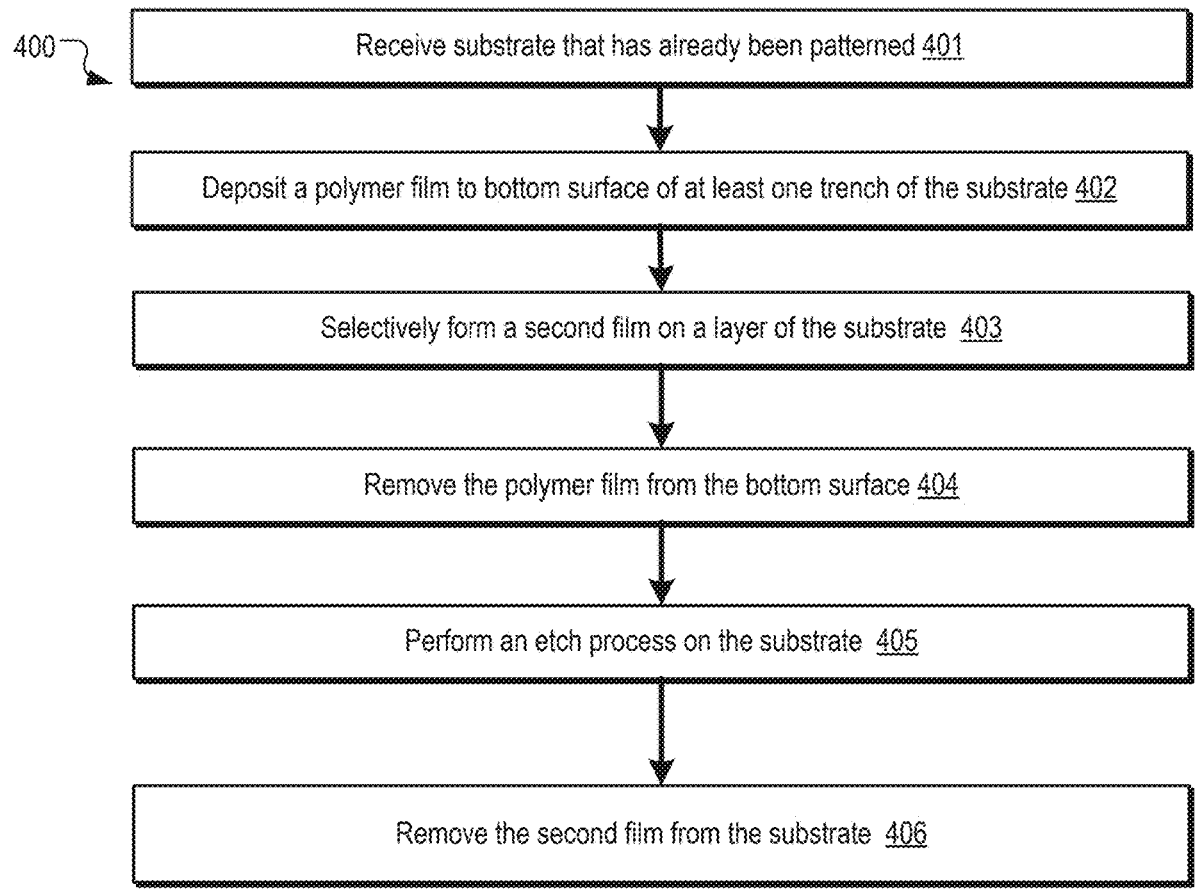
FIG. 4 is a flow chart representing a method for selectively cleaning a substrate according to an embodiment of the present disclosure.
Figure 5:
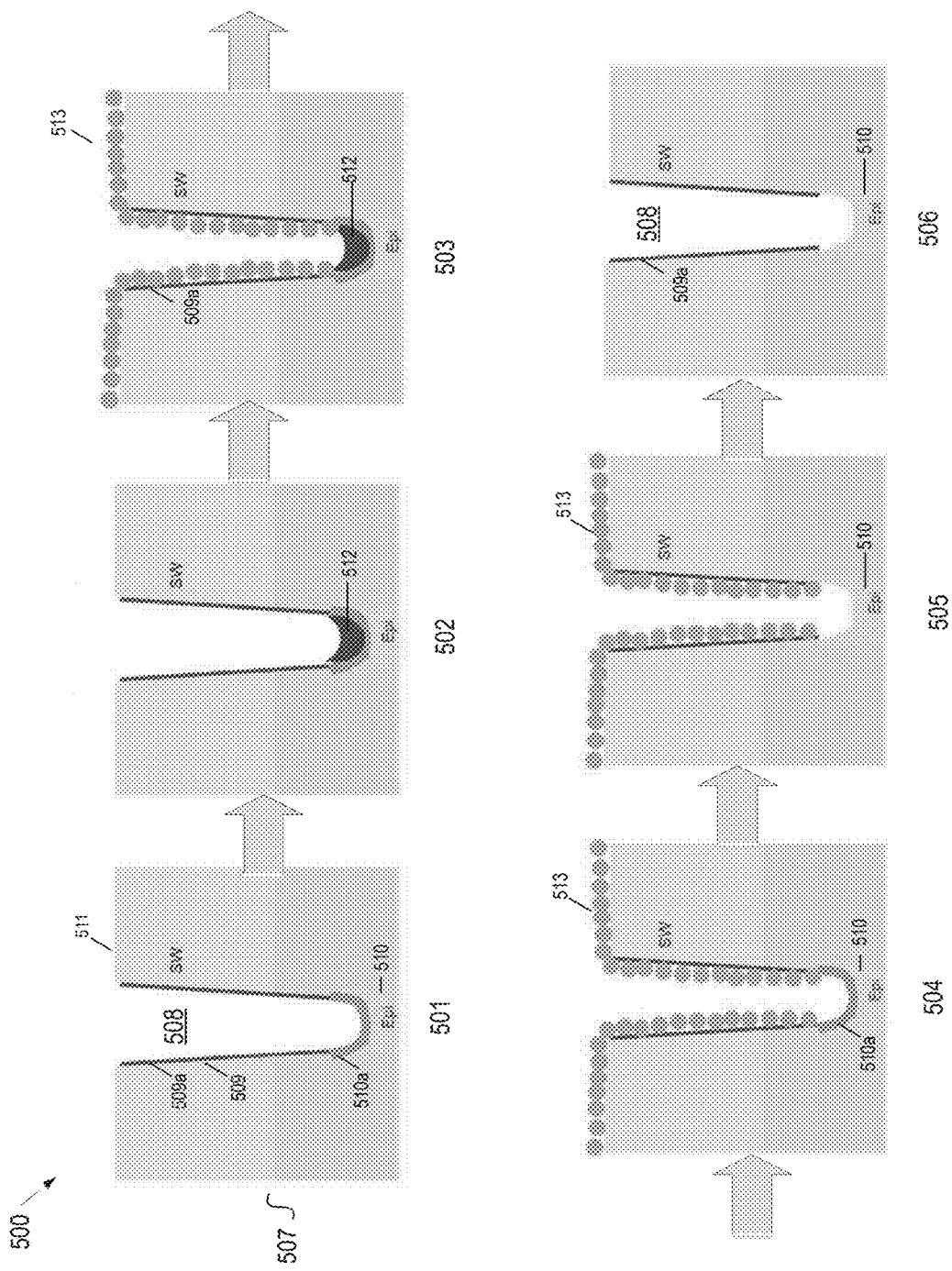
FIG. 5 illustrates the trench of a substrate being selectively cleaned according to an embodiment of the present disclosure.

FIG. 4 is a flow chart representing a method 400 of selectively etching or cleaning a substrate according to an embodiment of the present disclosure. In the method 400, at block 401, a substrate is received that has already been patterned. The substrate may be patterned to have at least one trench. The at least one trench may have a top surface, at least one side wall surface and a bottom surface. For example, the substrate may have a trench as show in FIG. 5. In FIG. 5, a substrate 507 is formed having a trench 508 in block 501. The substrate 507 may include silicon. The trench 508 has a top surface 511, at least one side wall 509 and a bottom surface 510. The bottom surface 510 may have an epitaxial silicon oxide (epi) layer 510a that formed during formation of the trench 508 or afterwards. The at least one side wall 509 in some embodiments has a layer 509a, that is different from the epi layer 510a, formed on the side wall 509. The layer 509a may include silicon nitride (SiN) in one embodiment. In other embodiments, the layer 509a may be silicon, damaged silicon nitride, silicon oxide, or low κ material. As understood herein, the term "low κ material" refers to a material with a small relative dielectric constant (κ, kappa) relative to silicon dioxide. The method 400 of the present disclosure allows for the epi layer or another layer at the bottom of the trench 508 to be removed without etching the sidewall 509.

Referring back to FIG. 4, after receiving the patterned substrate, a polymer film is deposited to the bottom surface of the at least one trench of the substrate. This can be seen in 502 of FIG. 5. In block 502, a polymer film 512 is deposited onto the bottom surface. The polymer film 512 may be deposited using capillary action. By using capillary action, low vapor pressure and low reactivity is beneficial. Further, to use capillary action, the chamber should be below the boiling point of the polymer film 512 so that the polymer film 512 may condense in the bottom of the trench. The polymer film 312 may be deposited to a target height of the trench 308. The target height may be about 1 nm to about 100 nm, about 10 nm to about 90 nm, about 20 nm to about 80 nm, about 30 nm to about 70 nm, about 40 to about 60 nm, or about 45 nm to about 55 nm. The polymer film 512 may be deposited by flowing the film to the bottom surface 510 of the trench.

In embodiments, the polymer film 512 is formed via a flowable film deposition process, such as flowable CVD. In such a process, a liquid precursor may be deposited on the substrate, which may flow to low points (e.g., bottoms of trenches) in the substrate.

In some embodiments, the polymer film 512 may include a carbon-based compound. The carbon-based compound may include a material, or may be formed from a precursor, selected from Formula A.

wherein, Formula A includes two reactive groups "—Y" arranged in the para position around a central aromatic ring. In one embodiment, —Y groups may include a hydroxide group, an aldehyde group, a ketone group, an acid group, an amino group, an isocyanate group, a thiocyanate group, or an acyl chloride group, among other reactive groups. In other embodiments, there may be two or more —Y groups, three or more —Y groups, four or more —Y groups, five or more —Y groups etc. that are arranged around the aromatic ring. Additional embodiments may also include each —Y group being the same reactive group, at least two —Y groups being different reactive groups, and all —Y groups being different reactive groups, among other combinations of —Y groups in the carbon-based compound and/or a precursor. Specific examples of the carbon-based compound or precursor include hydroquinone, terephthalaldehyde, terephthaloyl chloride, and p-phenylenediamine, among others.

In some embodiments, the polymer film 512 may include a material, or may be formed from a precursor, selected from Formula 1 and 2, which may be alternatively pulsed to a chamber using a MLD process as described in FIG. 3. The MLD temperature window may be less than 150° C.

In embodiments, Formula 1 may be:

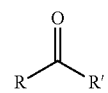

wherein R may be H, an alkyl group, or an aryl group and R' may be Cl, Br, I OR, OH, H NR$_2$, Si(NCO)$_4$, Si(NCS)$_4$, or

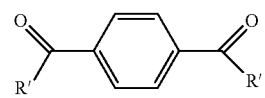

wherein R may be H, an alkyl group, or an aryl group and R' may be Cl, Br, I OR, OH, H NR$_2$.

In embodiments, Formula 2 may be

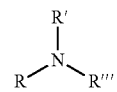

wherein, R, R', and R" may each independently may be H, an alkyl group or an aryl group; or

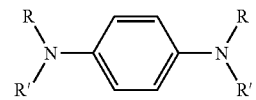

wherein, R, R', and R" may each independently may be H, an alkyl group or an aryl group.

In some embodiments, the polymer film 512 may be terephthalaldehyde. It has been found that terephthalaldehyde may be effective by itself, without an amine, by tuning the pulse process, such as by tuning the temperature of the pulse process.

In some embodiments, the polymer film 512 may be a flowable film that flows to the bottom surface 510 of the trench 508 during depositing of the polymer film 512 in block 502. The depositing of the polymer film 512 may occur at a temperature in a target temperature range. The target temperature range may be about 0° C. to about 400° C., about 25° C. to about 300° C., about 50° C. to about 250° C., or about 75° C. to about 200° C., or about 200° C. to about 400° C., about 100° C. to about 300° C., or any value or sub range not disclosed herein. The polymer film 512 flows to the bottom surface 510 of the trench 508 without sticking to the side walls 509.

During depositing of the polymer film 512, a purge gas may also be applied. The purge gas may be any inert gas, such as nitrogen, argon or helium. The depositing of the polymer film may be performed using a molecular layer deposition (MLD) or chemical vapor deposition (CVD) process in embodiments.

Referring back to FIG. 4, after the polymer film is deposited to the bottom surface of the trench, a second film is selectively formed on a layer of the substrate. The second film may be a blocking film. The second film is selectively formed on a layer of the substrate without forming the second film on the polymer film in block 403. That is, the second film may be formed on the top surface of the at least one trench, on at least one side wall of the at least one trench, or a combination of both. This can be seen in block 503 of FIG. 5. As can be seen in FIG. 5, a second film 513, i.e. a blocking film, is formed on layer 509a of the substrate. The second film 513 may include a self-assembled monolayer (SAM) that does not form on the polymer film 512. In embodiments, the second film 513 is formed using an ALD or MLD process, such as is described with reference to FIG. 3. In other embodiments, the second film 513 may be formed using chemical passivation.

The second film 513 may include at least one of a silyl amide, a silyl halide, a silyl alkoxide or a cyclic silylamide in embodiments. The silyl amide is a compound according to Formula III, the silyl halide is a compound according to Formula IV, the silyl alkoxide is a compound according to Formula V, and the cyclic silylamide is a compound having a $C_3$-$C_8$ ring.

   Formula III wherein in Formula III, R is each independently a $C_1$-$C_{18}$ alkyl group, a $C_1$-$C_{18}$ alkene group, a $C_1$-$C_{18}$ alkyne group, a $C_1$-$C_{18}$ aliphatic group, or a $C_1$-$C_{18}$ aromatic and n=1-3;

   Formula IV wherein in Formula IV, R is each independently a $C_1$-$C_{18}$ alkyl group, a $C_1$-$C_{18}$ alkene group, a $C_1$-$C_{18}$ alkyne group, a $C_1$-$C_{18}$ aliphatic group, a $C_1$-$C_{18}$ aromatic,
X is Cl, F, Br or I and n=1-3; and

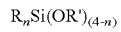   Formula V wherein in Formula V, R is each independently a $C_1$-$C_{18}$ alkyl group, a $C_1$-$C_{18}$ alkene group, a $C_1$-$C_{18}$ alkyne group, a $C_1$-$C_{18}$ aliphatic group, or a $C_1$-$C_{18}$ aromatic and n=1-3.

In some embodiments, a silyl amide may be used for SiO functionalization of a surface. In other embodiments, an aldehyde may be used as the second film if SiN functionalization may be used. In yet another embodiment, silyl-chlorides may be used for functionalization of both SiN and SiO.

The second film 513 may be selectively formed on the surfaces of the trench 508 without forming on the polymer film on the bottom of the trench. As illustrated in block 503, the second film 513 is selectively formed on the top surface 511 and side wall 509 of the trench 508 without forming on the polymer film 512. Alternatively, the second film 513 may be selectively formed on only the side walls 509 of the trench 508.

In an alternative embodiment, forming the second film 513 may be repeated as there is a selectivity window of the second film material and to ensure that the side wall surface is fully or nearly fully covered with the SAM. That is, there may be gaps when applying the second film 513, or SAM on the side walls, depending on the chemical used, so multiple cycles may be performed. Thus, the second film 513 or SAM has selectivity such that it only forms on the side wall.

Referring back to the flow chart of FIG. 4, after the second film is formed on the substrate, the polymer film is then removed from the bottom surface of the trench in block 404. This is illustrate in block 504 of FIG. 5, which will be described herein. As can be seen in FIG. 5, the polymer film 512 is removed from the bottom surface 510 of the trench after the second film is formed. The polymer film may be removed by heating the substrate in embodiments. The substrate may be heated within the boiling point range of the polymer film 512. The boiling point range may be about 200° C. to about 400° C., or about 2500 to about 350° C. The substrate may be heated for about 5 minutes to about 30 minutes, about 10 minutes to about 25 minutes, or about 15 minutes to about 20 minutes. As a result of heating the substrate, the polymer film may transition to a gas, which may be pumped out of a chamber in which the substrate is processed.

In some embodiments, the polymer film may be removed using a plasma. For example, the substrate may be exposed to a plasma containing $H_2$, $NF_3$, Ar, He, $N_2$, $O_2$ and/or a mixture thereof. The plasma may react with the polymer film to form a gas, which may be pumped from a chamber containing the substrate.

As can be seen in FIG. 4, after the polymer film is removed in block 404, an etch process is then performed on the substrate in block 405. This is illustrated in block 505 of FIG. 5. The bottom surface 510 of the trench 508 may be etched using an etch chemistry. During etching of the bottom surface 510 of the trench 508, the second film 513 protects the side walls from the etch chemistry, i.e., selectively etching the substrate. During the etching process, the epi oxide (e.g., epitaxial silicon dioxide) may be removed from the bottom surface. In some embodiments, the chemical etching process may be performed using ammonia and/or hydrofluoric acid. Other chemicals that may be used include, but are not limited to, are ammonia and water, NHF, $NH_4F$, hydrogen fluoride, or hydrogen chloride. In embodiments, the etch process is a plasma etch process. In embodiments, the etch process is a wet etch process. The etching process may also be an isotropic etching or an anisotropic etching.

As can be seen in FIG. 4, after the etch process is performed, the second film is then removed from the substrate in block 406. This can also be seen in block 506 of FIG. 5, where the second film 513 is removed from the side wall of the trench. The second film 513 may be removed through an additional chemical etching process, using one of the chemicals described above. Thus, after undergoing the selective etching process, the trench 508 of the substrate does not have the epi layer and maintains the profile of the trench because it was protected by the SAM during the etching process.

The chemical etching process may be performed using ammonia and hydrofluoric acid or ammonium fluoride. Other chemicals that may be used include, but are not limited to, are ammonia and water, NHF, $NH_4F$, hydrogen fluoride, or hydrogen chloride.

In one embodiment, the etching process may be performed using ammonium fluoride. When the SAM is formed on the side wall, the carbon-based groups prevent the ammonium fluoride from interacting with the side wall. Thus, this carbon-based group acts as the blocking agent during the chemical etching process of the trench.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
    placing a substrate into a chamber, the substrate comprising a layer including at least one trench formed therein, the at least one trench having a top surface, a bottom surface, and at least one side wall;
    depositing a polymer film on the bottom surface of the at least one trench without depositing the polymer film on the at least one side wall of the at least one trench, wherein the polymer film is a flowable film that flows to the bottom surface of the at least one trench during depositing of the flowable film at a temperature in a target temperature range;
    selectively forming a second film on the layer without forming the second film on the polymer film;
    removing the polymer film from the bottom surface of the at least one trench; and
    etching the bottom surface of the trench using an etch chemistry, wherein the second film protects the at least one sidewall from the etch chemistry.

2. The method of claim 1, wherein the second film comprises a self-assembled monolayer (SAM) that does not form on the polymer film.

3. The method of claim 1, wherein the layer comprises silicon, silicon nitride, damaged silicon nitride, silicon oxide, or low K material, wherein the substrate comprises silicon.

4. The method of claim 1, wherein the bottom surface has a U-shaped profile and comprises the substrate.

5. The method of claim 1, further comprising removing the second film after performing the etching.

6. The method of claim 1, wherein removing the polymer film comprises at least one of heating the polymer film or exposing the polymer film to a plasma.

7. The method of claim 1, wherein the polymer film comprises a carbon-based compound.

8. The method of claim 7, wherein the carbon-based compound comprises at least one precursor selected from Formula 1 and Formula 2, wherein Formula 1 is one of the following:

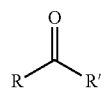

wherein R is H, an alkyl group, or an aryl group and R' is Cl, Br, I OR, OH, H, $NR_2$, $Si(NCO)_4$, $Si(NCS)_4$, or

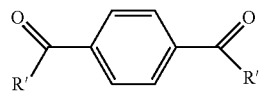

wherein R' is Cl, Br, I OR, OH, H or $NR_2$; and wherein Formula 2 is one of the following:

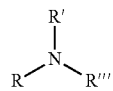

wherein, R, R', and R''' are each independently H, an alkyl group or an aryl group; or

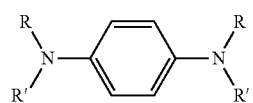

wherein, R, and R', are each independently H, an alkyl group or an aryl group.

9. The method of claim 7, wherein the carbon-based compound comprises precursor selected from Formula A:

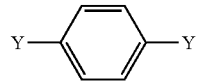

wherein, Y is a hydroxide group, an aldehyde group, a ketone group, an acid group, an amino group, an isocyanate group, a thiocyanate group, or an acyl chloride group.

10. The method of claim 7, wherein the carbon-based compound is terephthalaldehyde.

11. The method of claim 1, wherein the second film comprises at least one of a silyl amide, a silyl halide, a silyl alkoxide or a cyclic silylamide.

12. The method of claim 11, wherein the silyl amide is a compound according to Formula III, the silyl halide is a compound according to Formula IV, the silyl alkoxide is a compound according to Formula V, and the cyclic silylamide is a compound having a $C_3$-$C_8$ ring:

$R_n Si(NR'2)_{(4-n)}$ Formula III, wherein in Formula III, R is each independently a $C_1$-$C_{18}$ alkyl group, a $C_1$-$C_{18}$ alkene group, a $C_1$-$C_{18}$ alkyne group, a $C_1$-$C_{18}$ aliphatic group, or a $C_1$-$C_{18}$ aromatic and n=1-3;

$R_n SiX_{(4-n)}$ Formula IV, wherein in Formula IV, R is each independently a $C_1$-$C_{18}$ alkyl group, a $C_1$-$C_{18}$ alkene group, a $C_1$-$C_{18}$ alkyne group, a $C_1$-$C_{18}$ aliphatic group, a $C_1$-$C_{18}$ aromatic, X is Cl, Br or I and n=1-3; and $R_n Si(OR')_{(4-n)}$ Formula V, wherein in Formula V, R is each independently a $C_1$-$C_{18}$ alkyl group, a $C_1$-$C_{18}$ alkene group, a $C_1$-$C_{18}$ alkyne group, a $C_1$-$C_{18}$ aliphatic group, or a $C_1$-$C_{18}$ aromatic and n=1-3.

13. The method of claim 1, wherein the at least one sidewall of the at least one trench is not etched as a result of being protected from the etch chemistry by the second film.

14. The method of claim 1, further comprising removing an oxide from the bottom surface of the at least one trench during the etching.

15. The method of claim 1, wherein the etch chemistry comprises ammonium fluoride.

16. A method comprising:
placing a substrate into a chamber, the substrate comprising a layer including at least one trench formed therein, the at least one trench having a top surface, a bottom surface, and at least one side wall;
depositing a polymer film on the bottom surface of the at least one trench without depositing the polymer film on the least one side wall of the at least one trench, wherein the polymer film is a flowable film that flows to the bottom surface of the at least one trench during depositing of the flowable film at a temperature in a target temperature range; and
selectively forming a second film on the layer without forming the second film on the polymer film.

17. The method of claim 16, wherein the polymer film is terephthalaldehyde and the second film comprises a self-assembled monolayer (SAM) that does not form on the polymer film.

18. A method comprising:
placing a substrate into a chamber, the substrate comprising a layer including at least one trench formed therein, the at least one trench having a top surface, a bottom surface, and at least one side wall;
depositing a polymer film on the bottom surface of the at least one trench without depositing the polymer film on the least one side wall of the at least one trench, wherein the polymer film is a flowable film that flows to the bottom surface of the at least one trench during depositing of the flowable film at a temperature in a target temperature range; and
selectively forming a second film on the layer without forming the second film on the polymer film,
removing the polymer film from the bottom surface of the at least one trench,
performing an etch process, wherein the etch process comprises applying ammonium fluoride to the substrate,
wherein the performing the etch process selectively interacts with the bottom surface of the at least one trench and does not interact with the top surface and the at least one side wall.

* * * * *